United States Patent
Suzuki

(10) Patent No.: US 8,138,800 B2
(45) Date of Patent: Mar. 20, 2012

(54) PHASE DETECTING CIRCUIT AND PLL CIRCUIT

(75) Inventor: Atsushi Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/728,120

(22) Filed: Mar. 19, 2010

(65) Prior Publication Data

US 2011/0187413 A1 Aug. 4, 2011

(30) Foreign Application Priority Data

Feb. 4, 2010 (JP) ................................. 2010-023474

(51) Int. Cl.
*H03D 13/00* (2006.01)
(52) U.S. Cl. .................. 327/12; 327/7; 327/3
(58) Field of Classification Search .................. 327/2, 3, 327/7, 12
See application file for complete search history.

(56) References Cited

U.S. PATENT DOCUMENTS

| 6,552,616 | B1 * | 4/2003 | Lai et al. ...................... 331/1 A |
| 7,443,206 | B1 * | 10/2008 | Fernandez ...................... 327/12 |
| 7,598,775 | B2 * | 10/2009 | Hu et al. ...................... 327/12 |
| 7,940,088 | B1 * | 5/2011 | Sampath et al. ............... 327/12 |

FOREIGN PATENT DOCUMENTS

JP 2003-209464 A 7/2003
JP 2005-051693 A 2/2005

OTHER PUBLICATIONS

Explanation of Non-English Language References.

* cited by examiner

*Primary Examiner* — Hai L Nguyen
(74) *Attorney, Agent, or Firm* — Knobbe Martens Olson & Bear LLP

(57) ABSTRACT

A phase detecting circuit includes a latch circuit that switches, based on an OR signal and an AND signal of two clock signals to be subjected to phase comparison, one of outputs used for generation of two pulse signals on an advance phase side and a delay phase side to a preparation operation state for performing the phase comparison and a circuit operation state after the phase comparison, and holds the output in the states.

2 Claims, 5 Drawing Sheets

PHASE DETECTING CIRCUIT AND PLL CIRCUIT

CROSS-REFERENCE TO RELATED APPLICATIONS

This application is based upon and claims the benefit of priority from the prior Japanese Patent Application No. 2010-023474, filed on Feb. 4, 2010; the entire contents of which are incorporated herein by reference.

BACKGROUND OF THE INVENTION

1. Field of the Invention

The present invention relates to a phase detecting circuit and a phase-locked loop (PLL) circuit.

2. Description of the Related Art

In a PLL circuit that generates a system clock signal synchronized with a reference clock signal, a phase detecting circuit generates, based on a phase difference of the system clock signal (a frequency-divided clock signal) from the reference clock signal, two control pulse signals (an UP signal and a DOWN signal) given to a charge pump circuit.

The phase detecting circuit includes a first flip-flop circuit, a data input to which is a power supply voltage and a clock input to which is the frequency-divided clock signal, a second flip-flop circuit, a data input to which is the power supply voltage and a clock input to which is the reference clock signal, and an AND circuit that generates, based on timing when an AND of data outputs of the first and second flip-flop circuits holds, a reset signal simultaneously applied to reset terminals of both the flip-flip circuits (see, for example, JP-A. 2005-51693 (KOKAI) and JP-A. 2003-209464 (KOKAI)).

Consequently, with extinction timing of the reset signal set as the end, the UP signal is output from a data output terminal of the first flip-flop circuit and the DOWN signal is output from a data output terminal of the second flip-flop circuit. The reset signal is generated with pulse width set equal to time from the timing when the AND holds until a delay time in the AND circuit elapses.

Specifically, one of the UP signal and the DOWN signal output from the two flip-flop circuits changes to a control pulse signal on an advance phase side, and pulse width on the advance phase side has time width obtained by adding the pulse width of the reset signal to time width corresponding to a phase difference between both the clock signals. The other of the UP signal and the DOWN signal changes to a control pulse signal on a delay phase side and the pulse width on the delay phase side has the pulse width of the reset signal.

As a phase detecting function of the phase detecting circuit, the pulse width of the generated two control pulse signals is desirably pulse width corresponding to the phase signal between both the clock signals on the advance phase side, and is desirably pulse width as narrow as possible on the delay phase side. Therefore, it is necessary to reduce the pulse width of the reset signal.

However, because of an operation characteristic of the flip-flop circuits, the reset signal has minimum pulse width required for the reset signal. The pulse width of the reset signal cannot be reduced to be smaller than the minimum pulse width. On the other hand, when the pulse width of the reset signal is set to the minimum pulse width, because of, for example, a fluctuation of threshold value due to use for a long time, in some case, an output reset signal is crushed and the two flip-flop circuits cannot be reset. Delay time in the AND circuit fluctuates because of the influence of an operation condition, environmental temperature, and a manufacturing process. In the configuration of the phase detecting circuit explained above, it is necessary to design the delay time in the AND circuit long to some extent such that pulse width that withstands various kinds of fluctuation and is enough for the operation of the flip-flop circuits can be obtained. Therefore, it is difficult to improve the function of the phase detecting circuit.

SUMMARY OF THE INVENTION

According to one aspect of the present invention, a phase detecting circuit includes a latch circuit that switches, based on an OR signal and an AND signal of two clock signals to be subjected to phase comparison, one of outputs used for generation of two pulse signals on an advance phase side and a delay phase side to a preparation operation state for performing the phase comparison and a circuit operation state after the phase comparison, and holds the outputs in the states.

According to one aspect of the present invention, a PLL circuit includes a phase detecting circuit including a latch circuit that switches, based on an OR signal and an AND signal of a reference clock signal to be subjected to phase comparison and a frequency-divided clock signal obtained by frequency-dividing a system clock signal, one of outputs used for generation of two pulse signals on an advance phase side and a delay phase side to a preparation operation state for performing the phase comparison and a circuit operation state after the phase comparison, and holds the output in the states; a charge pump circuit that supplies an electric current corresponding to pulse widths of the two pulse signals; a loop filter that converts the electric current from the charge pump circuit into a control voltage signal; and a voltage control oscillation circuit that generates the system clock signal having a frequency corresponding to potential of the control voltage signal.

According to one aspect of the present invention, a PLL circuit includes a first frequency dividing circuit that frequency-divides a reference clock signal; a second frequency dividing circuit that frequency-divides a frequency-divided clock signal obtained by frequency-dividing a system clock signal; a phase detecting circuit including a latch circuit that switches, based on an OR signal and an AND signal of an output of the first frequency dividing circuit and an output of the second frequency dividing circuit to be subjected to phase comparison, one of outputs used for generation of two pulse signals on an advance phase side and a delay phase side to a preparation operation state for performing the phase comparison and a circuit operation state after the phase comparison, and holds the output in the states; a charge pump circuit that supplies an electric current corresponding to pulse widths of the two pulse signals; a loop filter that converts the electric current from the charge pump circuit into a control voltage signal; and a voltage control oscillation circuit that generates the system clock signal having a frequency corresponding to potential of the control voltage signal.

DETAILED DESCRIPTION OF THE INVENTION

Exemplary embodiments of the present invention are explained in detail below with reference to the accompanying drawings. The present invention is not limited by the embodiments.

Figure 1:
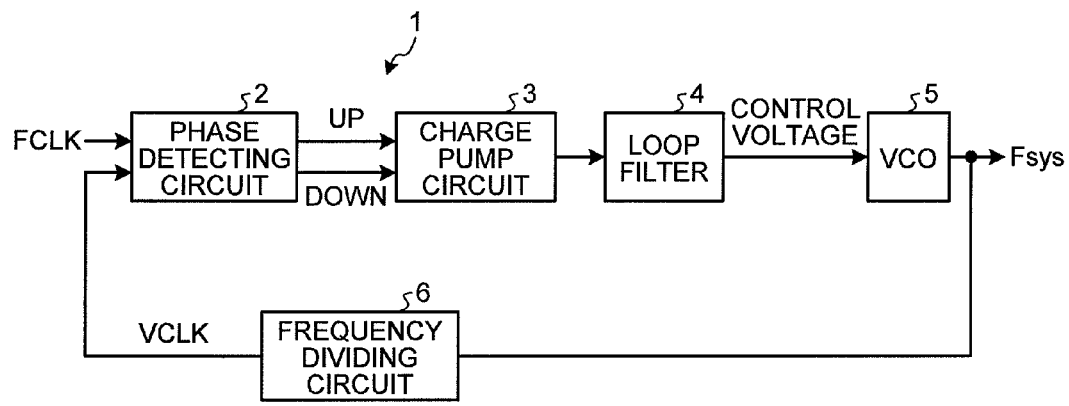
FIG. 1 is a block diagram illustrating the configuration of a PLL circuit including a phase detecting circuit according to a first embodiment of the present invention.
Figure 2:
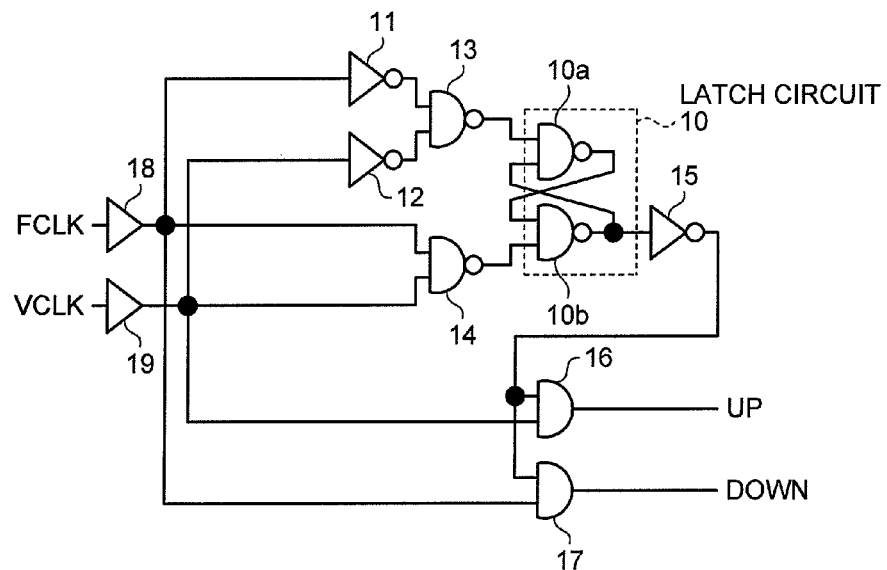
FIG. 2 is a circuit diagram illustrating the phase detecting circuit according to the embodiment.
Figure 3:
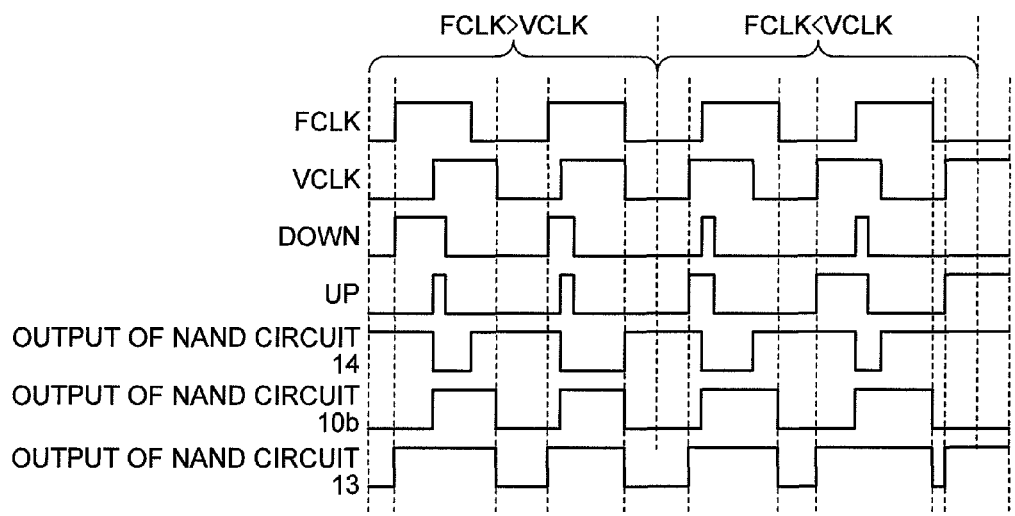
FIG. 3 is a timing chart for explaining the operation of the phase detecting circuit.
Figure 4:
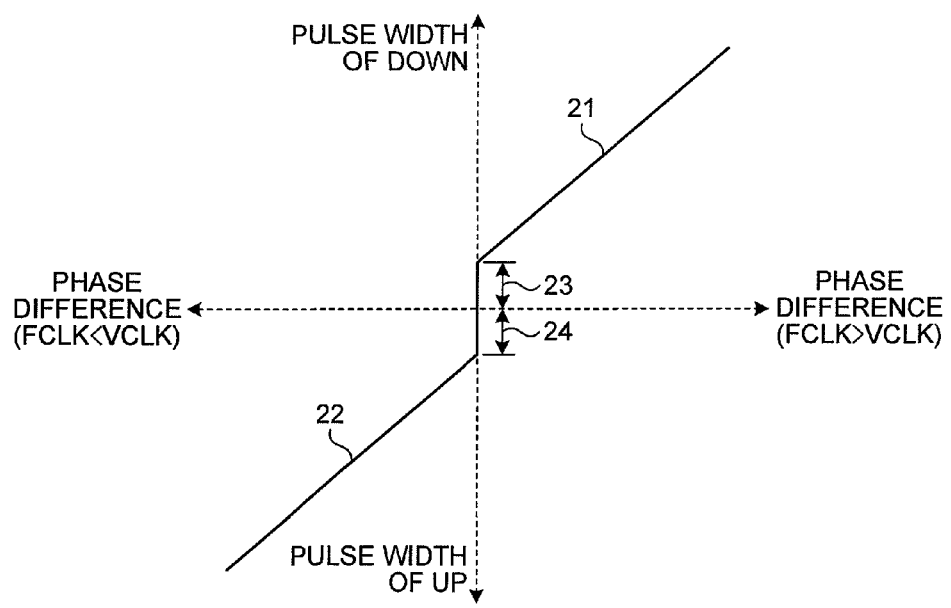
FIG. 4 is a characteristic chart for explaining a phase detecting function of the phase detecting circuit.

FIG. 1 is a block diagram illustrating the configuration of a PLL circuit including a phase detecting circuit according to a first embodiment of the present invention. FIG. 2 is a circuit diagram illustrating the phase detecting circuit according to the present invention. FIG. 3 is a timing chart for explaining the operation of the phase detecting circuit. FIG. 4 is a characteristic chart for explaining a phase detecting function of the phase detecting circuit.

A PLL circuit 1 shown in FIG. 1 includes a phase detecting circuit 2, a charge pump circuit 3, a loop filter 4, a voltage control oscillator (VCO) 5, and a frequency dividing circuit 6.

The operation of the PLL circuit 1 is briefly explained. In the configuration explained above, the VCO 5 outputs a system clock signal Fsys having a frequency corresponding to a control voltage input from the loop filter 4. The system clock signal Fsys is frequency-divided by the frequency dividing circuit 6 and input to the phase detecting circuit 2 as a frequency-divided clock signal VCLK. The phase detecting circuit 2 compares the frequency-divided clock signal VCLK and a reference clock signal FCLK input from the outside, and generates two control pulse signals (an UP signal and a DOWN signal) based on a result of the comparison (a phase difference). The charge pump circuit 3 charges or discharges, based on the two control pulse signals, a capacitative element included in the loop filter 4, and causes the loop filter 4 to output a predetermined control voltage to the VCO 5. According to the above operation, the system clock signal Fsys having a predetermined frequency synchronized with the reference clock signal FCLK is stably output from the VCO 5.

The phase detecting circuit 2 shown in FIG. 2 includes a latch circuit 10 of a set/reset type, inverters 11 and 12 and a NAND circuit 13 that configure a first input circuit, a NAND circuit 14 that configures a second input circuit, an inverter circuit 15 and AND circuits 16 and 17 that configure an output circuit, and buffers 18 and 19.

The latch circuit 10 includes NAND circuits 10a and 10b, input terminals and output terminals of which are respectively cross-connected. The reference clock signal FCLK is input to the inverter 11, one input terminal of the NAND circuit 14, and one input terminal of the AND circuit 17 via the buffer 18. The frequency-divided clock signal VCLK is input to the inverter 12, the other input terminal of the NAND circuit 14, and one input terminal of the AND circuit 16.

In the first input circuit, the reference clock signal FCLK is input to the NAND circuit 13 via the inverter 11 and the frequency-divided clock signal VCLK is input to the NAND circuit 13 via the inverter 12. The first input circuit outputs the reference clock signal FCLK and the frequency-divided clock signal VCLK to the other input terminal of the NAND circuit 10a as a NAND signal. In other words, the first input circuit configures an OR circuit and outputs an OR signal of the reference clock signal FCLK and the frequency-divided clock signal VCLK.

In the second input circuit, the reference clock signal FCLK and the frequency-divided clock signal VCLK are input to the NAND circuit 14. The second input circuit outputs the reference clock signal FCLK and the frequency-divided clock signal VCLK to the other input terminal of the NAND circuit 10b as a NAND signal.

In the output circuit, an output of the NAND circuit 10b is input to the other input terminals of the AND circuits 16 and 17 via the inverter circuit 15. The AND circuit 16 receives an output of the inverter circuit 15 and the frequency-divided clock signal VCLK and outputs the UP signal, which is one of the control pulse signals. The AND circuit 17 receives the output of the inverter circuit 15 and the reference clock signal FCLK and outputs the DOWN signal, which is the other of the control pulse signals.

In FIG. 2, the other input terminal of the NAND circuit 10a is used as a set terminal of the latch circuit 10 and the other input terminal of the NAND circuit 10b is used as a reset terminal of the latch circuit 10. The output of the NAND circuit 10b corresponds to an output of the latch circuit 10. When the relation of set and reset is reversed, an output of the NAND circuit 10a is the output of the latch circuit 10.

The operation of the phase detecting circuit 2 is explained with reference to FIG. 3. In FIG. 3, operation performed when a phase of the reference clock FCLK is more advanced than a phase of the frequency-divided clock signal VCLK (FCLK>VCLK) and operation performed when a phase of the reference clock FCLK is more delayed than a phase of the frequency-divided clock signal VCLK (FCLK<VCLK) are shown.

In the case of FCLK>VCLK, in a period until the reference clock signal FCLK rises, because the frequency-divided clock signal VCLK is also at a low level, an output of the NAND circuit 13 is at the low level and an output of the NAND circuit 14 is at a high level. Therefore, the latch circuit 10 is in an initial state (a reset state) and an output of the latch circuit 10 is at the low level. In this case, an output of the inverter circuit 15 is at the high level. However, because both the reference clock signal FCLK and the frequency-divided clock signal VCLK are at the low level, outputs of the AND circuits 16 and 17 remain at the low level.

When the reference clock signal FCLK rises, the output of the NAND circuit 13 changes to the high level. On the other hand, because the output of the NAND circuit 14 maintains the high level, the output of the latch circuit 10 maintains the low level latched earlier and the output of the inverter circuit 15 remains at the high level. Therefore, the DOWN signal, which is the output of the AND circuit 17, rises.

Thereafter, when the frequency-divided clock signal VCLK rises after certain time, the output of the NAND circuit 13 maintains the high level. However, the output of the NAND circuit 14 changes to the low level. Therefore, the output of the latch circuit 10 changes to the high level. At this point, in FIG. 3, timing when the output of the NAND circuit 14 changes to the low level and timing when the output of the NAND circuit 10b changes to the high level are shown as substantially the same. However, because of delay time in transmission through the circuits, the output of the NAND circuit 10b is at the low level and the output of the inverter circuit 15 is at the high level at the timing when the output of the NAND circuit 14 changes to the low level. Therefore, the UP signal, which is the output of the AND circuit 16 rises at timing when the frequency-divided clock signal VCLK rises.

The output of the inverter circuit 15 changes to the low level after certain delay time. The DOWN signal and the UP signal simultaneously fall.

In short, in the case of FCLK>VCLK, the pulse width of the UP signal depends on "delay time" caused in a path leading from the NAND circuit 14 to the inverter circuit 15 via the NAND circuit 10b. The pulse width of the DOWN signal is obtained by adding the "delay time" to time width equivalent to a phase difference between the reference clock signal FCLK and the frequency-divided clock signal VCLK.

Thereafter, when the reference clock signal FCLK falls and the frequency-divided clock signal VCLK falls, the output of the NAND circuit 13 changes to the low level. The latch circuit 10 returns to the initial state. In other words, the output of the latch circuit 10 changes to the low level. The phase detecting circuit shifts to the next comparing operation.

In the case of FCLK<VCLK, a phase relation is opposite to that in the case of FCLK>VCLK. Similarly, the UP signal and the DOWN signal are generated by adding the delay time caused in the path leading from the NAND circuit 14 to the inverter circuit 15 via the NAND circuit 10b thereto.

As explained above, the phase detecting circuit 2 generates, with the circuit configuration including the latch circuit, the two control pulse signals (the UP signal and the DOWN signal) by adding delay time from the input of the two clock signals to the output of the latch circuit thereto. The "delay time" corresponds to the pulse width of a signal for simultaneously resetting the two flip-flop circuits.

The phase detecting function of the phase detecting circuit 2 is explained with reference to FIG. 4. In FIG. 4, a phase relation between the reference clock signal FCLK and the frequency-divided clock signal VCLK is shown. On the abscissa, the right side indicates a phase difference in the case of FCLK>VCLK and the left side indicates a phase difference in the case of FCLK<VCLK. On the ordinate, the upper side indicates the pulse width of the DOWN signal and the lower side indicates the pulse width of the UP signal.

The pulse width of the DOWN signal changes along a straight line 21 according to the phase difference in the case of FCLK>VCLK. The pulse width of the UP signal changes along a straight line 22 according to the phase difference in the case of FCLK<VCLK. An ideal state is indicated by a straight line formed by the straight line 21 and the straight line 22 passing the origin.

However, in the phase detecting circuit 2, the delay time appears as biases 23 and 24 with respect to the straight lines 21 and 22 and makes the straight lines 21 and 22 discontinuous. The same holds true in the phase detecting circuit including the two flip-flop circuits explained above. The pulse width of the reset signal appears as the biases 23 and 24.

A first object of the present invention is to reduce the biases 23 and 24 as much as possible, i.e., reduce the delay time to be added as much as possible. A second object of the present invention is to make it possible to surely reset the two flip-flop circuits in a lock state of a PLL circuit. The phase detecting circuit 2 according to this embodiment can attain these objects.

The pulse width of the reset signal in the phase detecting circuit including the two flip-flop circuits needs to be certain width according to, for example, limitation on the circuit operation of the two flip-flop circuits and a transistor characteristic of the AND circuit that generates the reset signal. It is difficult to reduce the pulse width. On the other hand, the "delay time" in the phase detecting circuit 2 depends on the path leading from the NAND circuit 14 to the inverter circuit 15 via the NAND circuit 10b. The "delay time" can be easily reduced to be shorter than the pulse width of the reset signal and the phase detecting function can be improved. As a result, in the PLL circuit 1 including the phase detecting circuit 2, frequency stabilization in the lock state can be realized. This makes it less likely that the PLL circuit 1 deviates from the lock state.

In the phase detecting circuit including the two flip-flop circuits, to simultaneously set the two flip-flop circuits in the initial state, the reset signal generated from outputs of the two flip-flop circuits is used. However, when the pulse width of the reset signal is small, it is likely that the pulse width is crushed by a fluctuation of threshold value or the like in a process of use for a long time in the AND circuit that generates the reset signal. Therefore, in the lock state of the PLL circuit, in some case, the two flip-flop circuits cannot be reset. On the other hand, in the phase detecting circuit 2 according to this embodiment, when both the reference clock signal FCLK and the frequency-divided clock signal VCLK are at the low level, the latch circuit 10 is in the initial state. Therefore, the reset state can be secured as long as the PLL circuit is locked in a state in which both the clock signals are in-phase.

An operation state of the latch circuit 10 in the operation process for phase comparison of the two clock signals explained above is as explained below. Even if a first clock signal on the advance phase side rises, in a period until a second clock signal on the delay phase side rises, the latch circuit 10 is in the initial state (the reset state) and the output of the latch circuit 10 is set to the low level. In this period, one control pulse signal simply rises and detection of a phase difference is performed. When the second clock signal rises, the latch circuit 10 changes the output to the high level after certain delay time, maintains the high level until the second clock signal falls, and then shifts to the initial state.

In short, a state in which the output of the latch circuit 10 is latched to the low level can be referred to as a "preparation operation state" in which phase comparison is performed. On the other hand, a state in which the output of the latch circuit 10 is latched to the high level can be referred to as a "circuit operation state" after the phase comparison.

According to the operation process in the phase comparison of the two clock signals explained above, the latch circuit 10 changes to the preparation operation state and the circuit operation state using an OR signal and an AND signal of the reference clock signal FCLK and the frequency-divided clock signal VCLK.

In other words, the phase detecting circuit 2 is not limited to the configuration shown in FIG. 2. The phase detecting circuit 2 only has to have a configuration that changes to the preparation operation state and the circuit operation state using the OR signal and the AND signal of the reference clock signal FCLK and the frequency-divided clock signal VCLK. The first input circuit and the second input circuit are also not limited to the configuration shown in FIG. 2. The first input circuit and the second input circuit only have to have a configuration that can supply the OR signal and the AND signal of the reference clock signal FCLK and the frequency-divided clock signal VCLK to the latch circuit 10.

As explained above, according to the first embodiment, the delay time for specifying the ends of the two pulse signals generated based on the phase difference between the two clock signals depends on the transition of the output of the latch circuit. Therefore, the delay time can be reduced as much as possible and the improvement of the phase detecting function can be realized. As a result, in an incorporated PLL circuit, frequency stabilization in the lock state can be realized. This makes it less likely that the PLL circuit deviates from the lock state.

Figure 5:
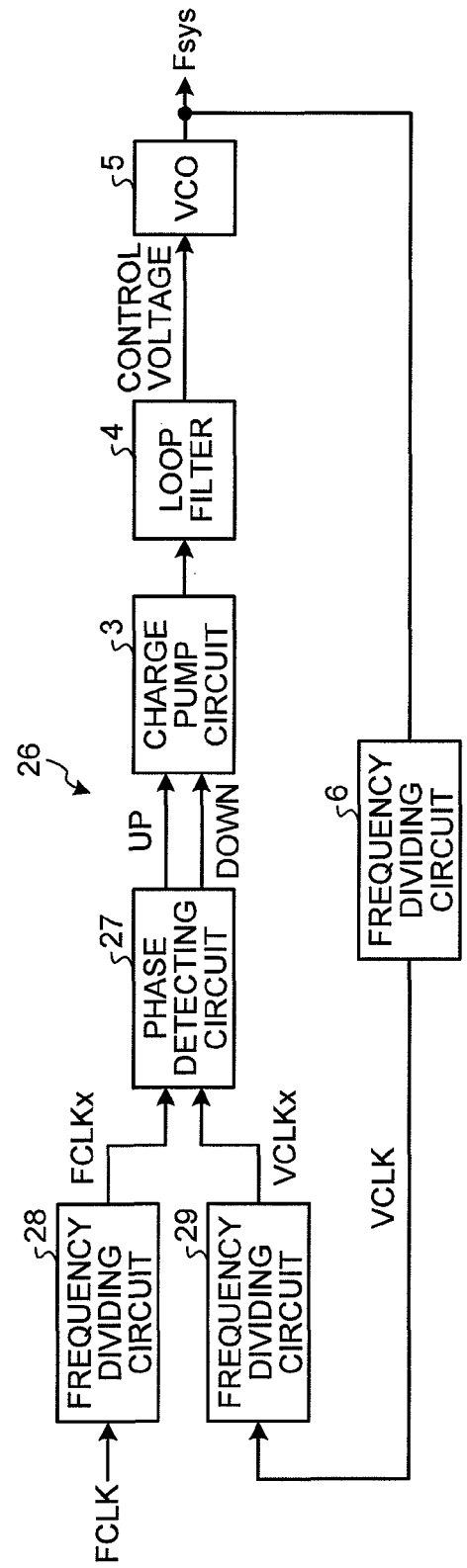
FIG. 5 is a block diagram illustrating the configuration of a PLL circuit including a phase detecting circuit according to a second embodiment of the present invention.
Figure 6:
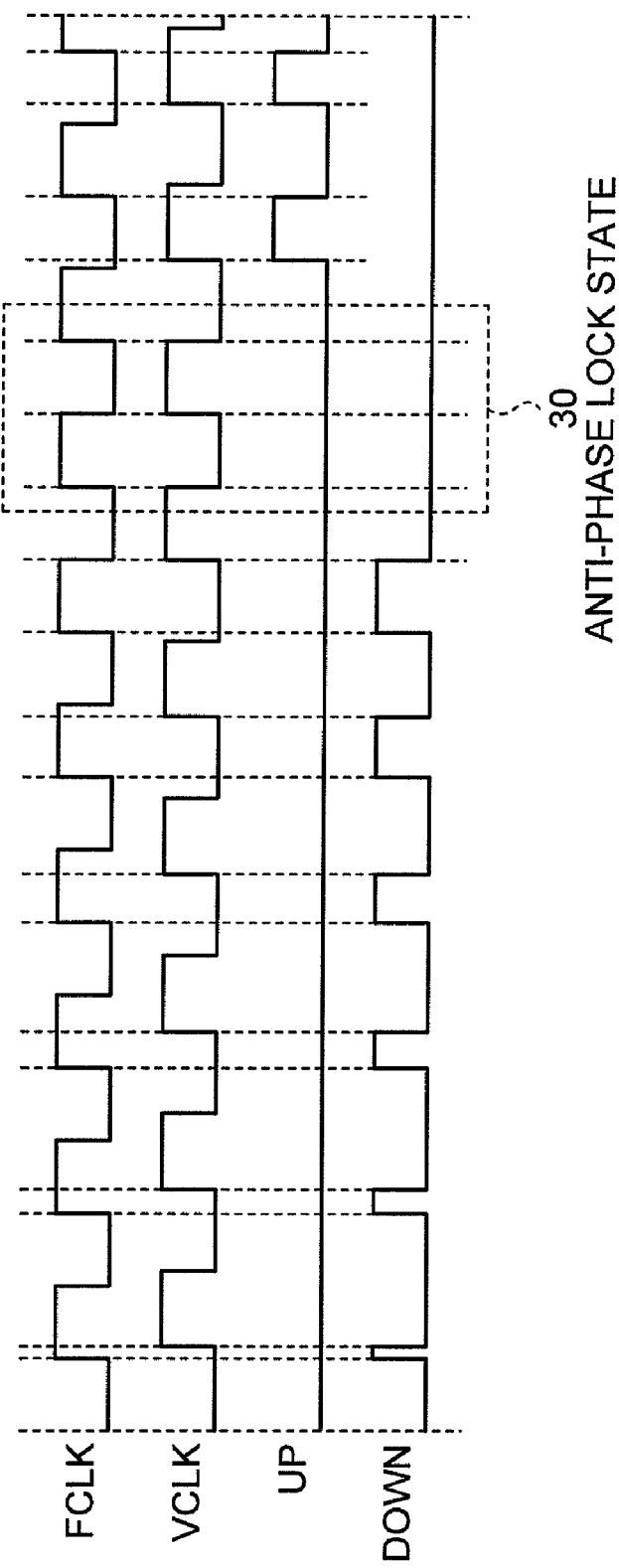
FIG. 6 is a waveform chart for explaining a relation between the phase detecting function and the duty of the phase detecting circuit shown in FIG. 2.
Figure 7:
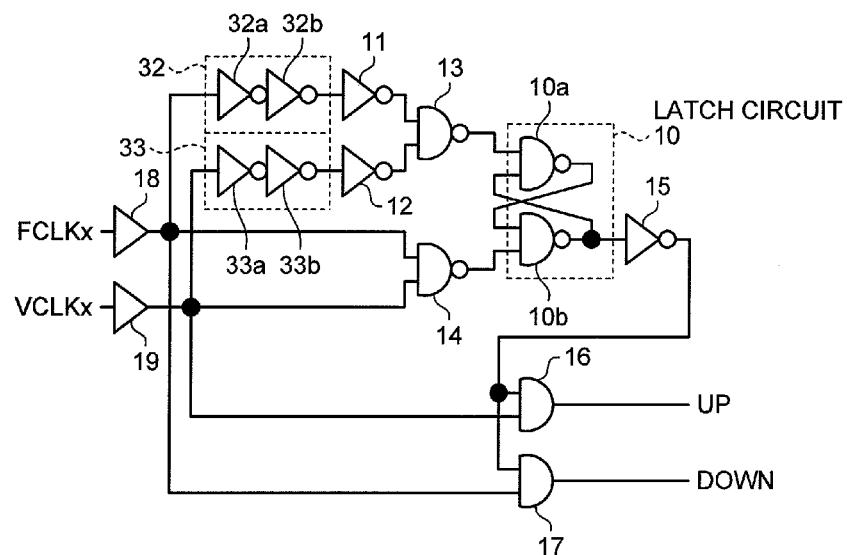
FIG. 7 is a circuit diagram illustrating the phase detecting circuit shown in FIG. 5.
Figure 8:
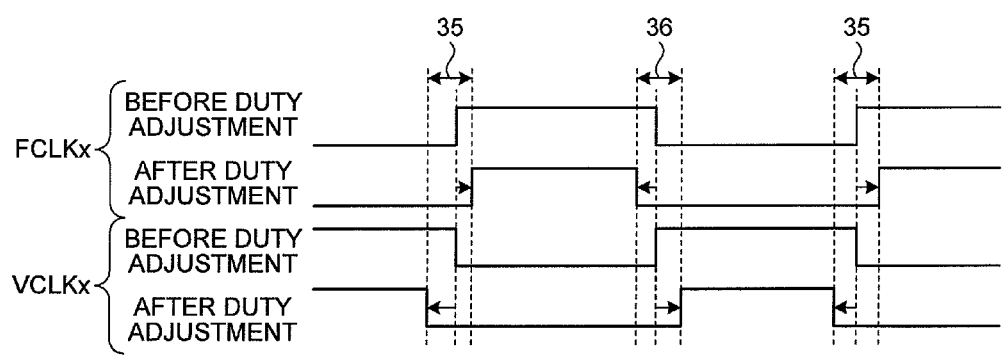
FIG. 8 is a waveform chart for explaining the operation of a duty adjusting circuit shown in FIG. 7.

FIG. 5 is a block diagram illustrating a PLL circuit including a phase detecting circuit according to a second embodiment of the present invention. FIG. 6 is a waveform chart for explaining a relation between the phase detecting function and the duty of the phase detecting circuit shown in FIG. 2. FIG. 7 is a circuit diagram illustrating the phase detecting circuit shown in FIG. 5. FIG. 8 is a waveform chart for explaining the operation of a duty adjusting circuit shown in FIG. 7.

In a PLL circuit 26 according to the second embodiment, a phase detecting circuit 27 is provided instead of the phase detecting circuit 2 of the configuration shown in FIG. 1 and frequency dividing circuits 28 and 29 are added to the configuration. Otherwise, the configuration of the PLL circuit 26 is the same as the configuration shown in FIG. 1. The frequency dividing circuit 28 gives a frequency-divided reference clock signal FCLKx, which is obtained by frequency-dividing the reference clock signal FCLK, to the phase detecting circuit 27. The frequency dividing circuit 29 gives a re-frequency-divided clock signal VCLKx, which is obtained by further frequency-dividing the frequency-divided clock signal VCLK, to the phase detecting circuit 27.

In FIG. 6, a phase relation between the reference clock signal FCLK and the frequency-divided clock signal VCLK input to the phase detecting circuit 2 near the lock state is shown. An anti-phase lock state 30 in which a phase is shifted 180 degrees is shown in the phase relation.

The phase detecting circuit 2 adopts a system for setting the latch circuit 10 in the initial state when both the reference clock signal FCLK and the frequency-divided clock signal VCLK are at the low level. When the anti-phase lock state 30 shown in FIG. 6 occurs, the phase detecting circuit 2 cannot set the latch circuit 10 in the initial state and the PLL circuit is locked in an anti-phase state.

Therefore, the phase detecting circuit 27 shown in FIG. 7 includes duty adjusting circuits 32 and 33 having a mechanism for delaying timing of a rising edge of a clock signal and advancing timing of a falling edge of the clock signal. When the duty of the reference clock signal FCLK can be controlled, this can be realized by providing the phase detecting circuit 27 instead of the phase detecting circuit 2 in the PLL circuit 1 shown in FIG. 1. On the other hand, when the duty of the reference clock signal FCLK cannot be controlled, this can be realized by providing the phase detecting circuit 27 in the PLL circuit 26 (FIG. 5) to which the two frequency dividing circuits 28 and 29 are added.

In FIG. 7, the duty adjusting circuit 32 is interposed in a path leading from the buffer 18, to which the frequency-divided reference clock signal FCLKx is input, to the inverter 11. The duty adjusting circuit 33 is interposed in a path leading from the buffer 19, to which the re-frequency-divided clock signal VCLKx is input, to the inverter 12.

The duty adjusting circuit 32 includes serial inverters 32a and 32b as a minimum configuration. The duty adjusting circuit 33 includes serial inverters 33a and 33b as a minimum configuration.

The inverters 32a and 32b and the inverters 33a and 33b used for duty adjustment are CMOS inverters. In a CMOS inverter, a load driving ability of a PMOS transistor is inferior to that of an NMOS transistor. Therefore, usually, a ratio of channel widths of the PMOS transistor and the NMOS transistor is designed to be about 2:1 such that timing of a rising edge and timing of a falling edge are substantially the same. When the timing of the rising edge is delayed or the timing of the falling edge is advanced, the channel width of the NMOS transistor is set to 1 to increase or reduce the channel width of the PMOS transistor. In the duty adjusting circuits 32 and 33 according to this embodiment, a ratio of channel widths of PMOS transistors and NMOS transistors of the inverters 32a and 33a in the first stage is designed to be about 4:1. A ratio of channel widths of PMOS transistors and NMOS transistors of the inverters 32b and 33b in the next stage is designed to be about 1:1.

The operation of the duty adjusting circuits 32 and 33 is explained with reference to FIG. 8. In FIG. 8, waveforms before and after duty adjustment of the frequency-divided reference clock signal FCLKx and the re-frequency-divided clock signal VCLKx are shown. Both the clock signals before the duty adjustment is in a state in which the clock signals are locked in phases opposite to each other.

In a duty adjustment period 35, timing of a rising edge of the frequency-divided reference clock signal FCLKx input from the buffer 18 is delayed by the duty adjusting circuit 32. Timing of a falling edge of the re-frequency-divided clock signal VCLKx input from the buffer 19 is advanced by the duty adjusting circuit 33.

In a duty adjustment period 36, timing of a falling edge of the frequency-divided reference clock signal FCLKx input from the buffer 18 is advanced by the duty adjusting circuit 32. Timing of a rising edge of the re-frequency-divided clock signal VCLKx input from the buffer 19 is delayed by the duty adjusting circuit 33.

Consequently, even if the frequency-divided reference clock signal FCLKx and the re-frequency-divided clock signal VCLKx are in an anti-phase lock state, when the clock signals are input to the inverters 11 and 12, timing when both the clock signals change to the low level is formed. Therefore, information indicating that both the clock signals change to the low level can be given to the latch circuit 10 from the NAND circuit 13 to set the latch circuit 10 in the initial state and surely prevent both the clock signals from changing to the anti-phase lock state.

As explained above, according to the second embodiment, a phase detecting circuit that can surely reset, even if phases of two clock signals are opposite to each other. As a result, in an incorporated PLL circuit, it is possible to prevent phases of a reference clock signal and a system clock signal generated by a VCO from being locked in phases opposite to each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A phase detecting circuit comprising:
   a latch circuit configured to switch, based on an OR signal and a NAND signal of two clock signals wherein the two clock signals are subjected to phase comparison, an output of the latch circuit configured to be used for generating two pulse signals on an advance phase side and a delay phase side, the output configured to switch between a preparation operation state for performing the phase comparison and a circuit operation state after the phase comparison, and configured to hold the output in the states,
   wherein the latch circuit comprises first and second NAND circuits, wherein input terminals and output terminals of the first and second NAND circuits are respectively cross-connected, and
   the phase detecting circuit further comprises:
      first and second inverters configured to respectively logically invert and output the two clock signals corresponding thereto;
      a third NAND circuit configured to output a NAND signal of outputs of the first and second inverters to the other input terminal of the first NAND circuit;

a fourth NAND circuit configured to output a NAND signal of the two clock finals to the other input terminal of the second NAND circuit;

a third inverter configured to logically invert and output an output of the second NAND circuit; and first and second AND circuits configured to respectively output, as the two pulse signals corresponding thereto, AND signals of an output of the third inverter and the two clock signals corresponding thereto.

2. A PLL circuit comprising:

a phase detecting circuit comprising a latch circuit configured to switch, based on an OR signal and a NAND signal of a reference clock signal wherein the reference clock signal is subjected to phase comparison and a frequency-divided clock signal obtained by frequency-dividing a system clock signal, an output of the latch circuit configured to be used for generating two pulse signals on an advance phase side and a delay phase side, the output configured to switch between a preparation operation state for performing the phase comparison and a circuit operation state after the phase comparison, and configured to hold the output in the states;

a charge pump circuit configured to supply an electric current corresponding to pulse widths of the two pulse signals;

a loop filter configured to convert the electric current from the charge pump circuit into a control voltage signal; and a voltage control oscillation circuit configured to generate the system clock signal having a frequency corresponding to a potential of the control voltage signal, wherein in the phase detecting circuit, the latch circuit comprises first and second NAND circuits, wherein input terminals and output terminals of the first and second NAND circuits are respectively cross-connected, and the phase detecting circuit further comprises:

first and second inverters configured to respectively logically invert and output the reference clock signal and the system clock signal corresponding thereto;

a third NAND circuit configured to output a NAND signal of outputs of the first and second inverters to the other input terminal of the first NAND circuit;

a fourth NAND circuit configured to output a NAND signal of the reference clock signal and the system clock signal to the other input terminal of the second NAND circuit;

a third inverter configured to logically invert and output an output of the second NAND circuit; and first and second AND circuits configured to respectively output, as the two pulse signals corresponding thereto, AND signals of an output of the third inverter and the reference clock signal and the system clock signal corresponding thereto.

* * * * *